United States Patent
Inda et al.

(10) Patent No.: US 9,926,935 B2
(45) Date of Patent: Mar. 27, 2018

(54) FAN ASSEMBLY AND ASSOCIATED SYSTEMS

(71) Applicant: ARRIS Enterprises, Inc., Suwanee, GA (US)

(72) Inventors: Carlos Gonzalez Inda, Guadalupe (MX); Julio Cesar Ayala Vera, Apodaca (MX); Oswaldo Enrique Linares Riva, Guadalupe (MX); Sergio Antonio Delon Canseco, Guadalupe (MX); Luis Lopez Moreno, Apodaca (MX)

(73) Assignee: ARRIS Enterprises LLC, Suwanee, GA (US)

( * ) Notice: Subject to any disclaimer, the term of this patent is extended or adjusted under 35 U.S.C. 154(b) by 410 days.

(21) Appl. No.: 14/683,260

(22) Filed: Apr. 10, 2015

(65) Prior Publication Data
US 2016/0298650 A1 Oct. 13, 2016

(51) Int. Cl.
*F04D 25/06* (2006.01)
*F04D 29/60* (2006.01)
*H05K 7/20* (2006.01)

(52) U.S. Cl.
CPC ....... *F04D 25/0613* (2013.01); *F04D 29/601* (2013.01); *H05K 7/20172* (2013.01)

(58) Field of Classification Search
CPC ........... H05K 7/20136; H05K 7/20145; H05K 7/20172; F04D 19/002; F04D 25/08; F04D 25/0613; F04D 29/522; F04D 29/601; F04D 29/602
USPC ........................................................ 361/695
See application file for complete search history.

(56) References Cited

U.S. PATENT DOCUMENTS

| | | | |
|---|---|---|---|
| 5,579,827 A * | 12/1996 | Chung | H01L 23/4093 165/121 |
| 5,788,566 A | 8/1998 | McAnally et al. | |
| 6,186,889 B1 | 2/2001 | Byrne | |
| 6,343,012 B1 | 1/2002 | Rife | |
| 6,357,247 B1 | 3/2002 | Moretti | |
| 6,650,541 B1 | 11/2003 | Simon et al. | |
| 6,714,411 B2 | 3/2004 | Thompson et al. | |
| 6,994,517 B2 | 2/2006 | Gatley, Jr. et al. | |
| 7,864,526 B2 * | 1/2011 | Liu | H01L 23/427 165/104.33 |
| 7,959,419 B2 | 6/2011 | Borowski et al. | |
| 8,405,989 B2 | 3/2013 | Wang | |
| 8,784,167 B2 | 7/2014 | Yi | |
| 2004/0191089 A1 | 9/2004 | Chang | |

(Continued)

*Primary Examiner* — Igor Kershteyn
*Assistant Examiner* — Eric Zamora Alvarez
(74) *Attorney, Agent, or Firm* — Lori Anne D. Swanson

(57) ABSTRACT

A fan assembly (100) includes a chassis portion (101) and a fan receiver (102) coupled to the chassis portion at a first end (105) of the fan receiver. A fan receiver sidewall defines an inner surface (401), an outer surface (402), a receiving opening (403), and a central axis (405). The inner surface can include at least one insertion guiderail key (514,614) oriented substantially parallel with the central axis. The outer surface can include a threaded male member (407) at a second end (106) of the fan receiver. A fan module (103) can nest within the fan receiver sidewall, retained therein by a vented endcap (104) that couples to the threaded male member with a threaded connection.

18 Claims, 8 Drawing Sheets

(56) References Cited

U.S. PATENT DOCUMENTS

2013/0328359 A1* 12/2013 Antonov ............... A47C 7/742
                                                                                         297/180.14

* cited by examiner

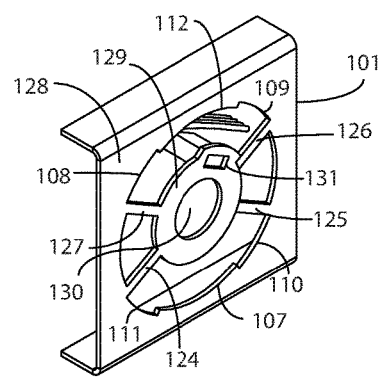
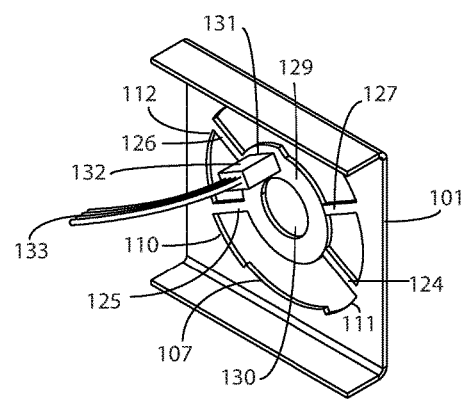
*FIG. 2*
*FIG. 3*
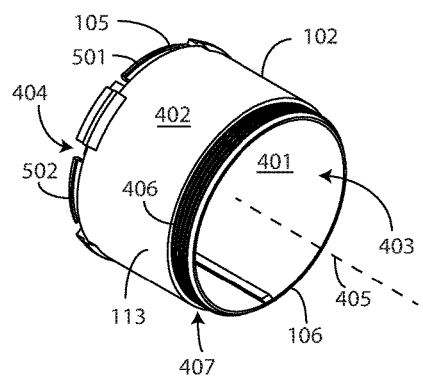
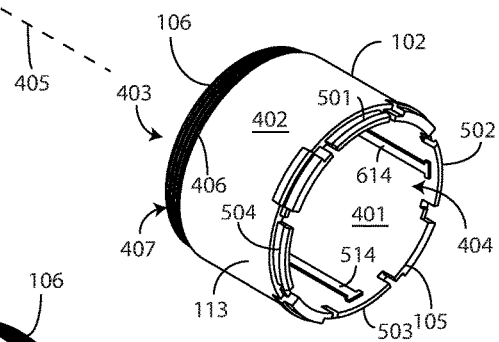
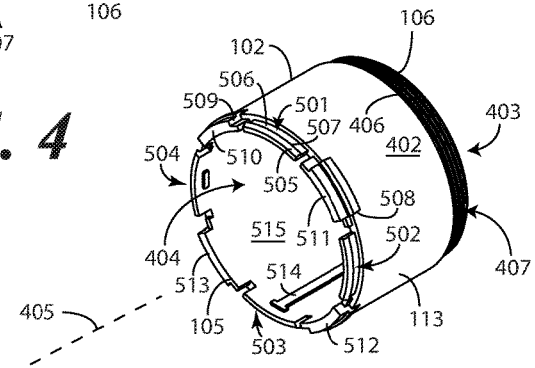
*FIG. 4*
*FIG. 6*
*FIG. 5*

FAN ASSEMBLY AND ASSOCIATED SYSTEMS

BACKGROUND

Technical Field

This disclosure relates generally to fans, and more particularly to fan assemblies.

Background Art

The processing power of integrated circuits and microprocessors is continually increasing. At the same time, the physical size of these devices is decreasing. Year after year, manufacturers produce smaller processors and integrated circuits that offer more computational power. While these technological advances yield smaller devices with more computational capabilities, there are tradeoffs that must be considered. A primary tradeoff is the fact that these smaller devices produce large amounts of heat, which must be removed for the devices to operate properly. This issue of excess heat generation is exacerbated when large numbers of integrated circuits and processors are densely populated in computer and server housings.

Illustrating by example, in server systems and other advanced computing platforms, large numbers of processors, memory devices, drivers, and other circuit components may be populated on printed circuit boards disposed within a chassis. When these components are all working simultaneously, they generate tremendous amounts of heat. This heat must be removed from the chassis to prevent the circuit components from overheating. Fans are traditionally used in chassis-based systems to remove heat so that electrical components within the chassis can function properly.

While fans are effective at removing heat, they frequently suffer from wear due to continual or intermittent operation. Due to this mechanical wear, many manufacturers recommend that fans be replaced after a predetermined amount of use. Replacement can occur either in the field or in a repair center. The decision determining where the electrical components must be taken "off-line" or out of service. Moreover, if replacement operations are difficult specialized technicians are required, which increases replacement cost.

It would be advantageous to have an improved fan assembly that allowed simple replacement of fans in the field without taking corresponding electrical equipment off-line.

BRIEF DESCRIPTION OF THE DRAWINGS

FIG. 2-3 illustrate various views of one explanatory chassis portion in accordance with one or more embodiments of the disclosure.

FIGS. 4-6 illustrate various views of one explanatory fan receiver in accordance with one or more embodiments of the disclosure.

Figure 1:
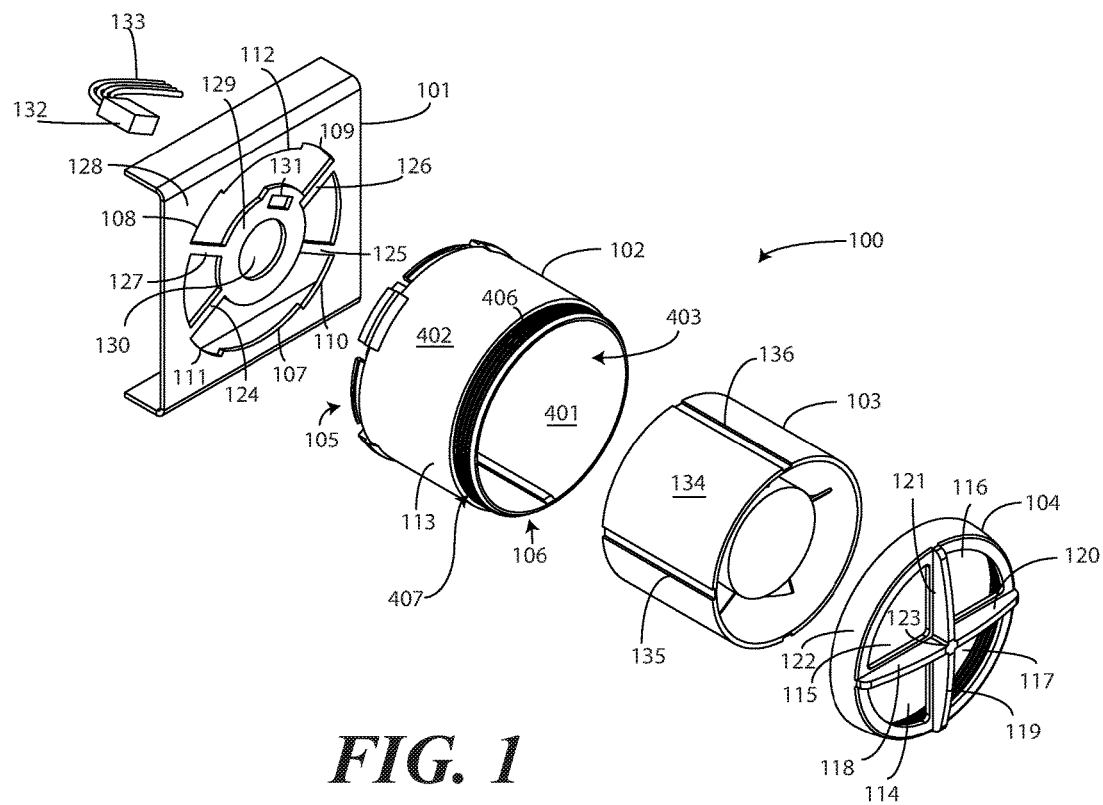
FIG. 1 illustrates one explanatory fan assembly in accordance with one or more embodiments of the disclosure.
Figure 7:
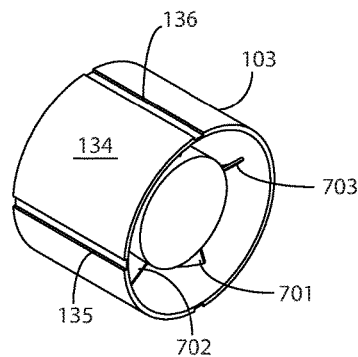
FIGS. 7-9 illustrate various views of one explanatory fan module in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. It is expected that one of ordinary skill, notwithstanding possibly significant effort and many design choices motivated by, for example, available time, current technology, and economic considerations, when guided by the concepts and principles disclosed herein will be readily capable of generating the fan assemblies, tool-less removal devices, and chassis configurations described below with minimal experimentation.

As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

As noted above, in advanced computing systems, large amounts of heat must be reliably removed from the housing or chassis of a computational device to keep the temperature-sensitive electronic circuits inside operating properly. The traditional method for removing heat is to place one or more fans along the vertical sidewalls of the chassis. These fans are bolted in place along the sidewalls to hold them in place. They are then powered by electronic busses disposed within the chassis.

While in this traditional configuration of bolting fans to the sidewalls, or alternatively bolting the fans to the bottom wall, fans can be functionally effective in removing heat, it is not without certain problems. Many of these computers systems are continually powered. Consequently, the fans attached to the chassis must run constantly. It is known, however, that fans periodically degrade and fail, and therefore must be replaced. In conventional systems, this requires powering down the electronic components in the chassis (and quite frequently the entire computational system those components support), removing the chassis from the system, at least partially disassembling the chassis with specialized tools to remove the fan. A technician must then replace the fan and re-assembling the chassis with the specialized tools. Only then can the electronic components and system be brought back on-line. These steps are labor intensive and time consuming to say the least, each of which results in additional cost for the system manufacturer.

Embodiments of the present disclosure provide a solution to the issues provides above. Embodiments of the disclosure provide a fan assembly where a fan module can be "hot swapped," i.e., replaced while the corresponding computer equipment remains operational. Additionally, fan modules in accordance with embodiments of the disclosure can be swapped without requiring any specialized tools or specialized training. In one embodiment, a first end of a fan receiver is coupled to a portion of a chassis. The fan receiver has a fan receiver sidewall that defines an inner surface, an outer surface, a receiving opening at the second end of the fan receiver, and a central axis. In one embodiment, the second end of the fan receiver further defines a threaded male member. An endcap having a threaded female member can couple to the fan receiver by way of a threaded connection. The endcap can be screwed on the fan receiver to retain a fan module nested within the fan receiver. Alternatively, the endcap can be unscrewed from the fan receiver to allow quick and simple replacement of the fan module.

The threaded fan receiver and endcap allows for easy replacement of a fan module during service. This replacement can be done without the necessity of either turning OFF the device to which the fan module is connected, and without opening the device. Additionally, no trained technicians are required and the replacement operation can be completed within a very short time.

In one or more embodiments, an electrical connector to power the fan module can be integrally coupled to an annulus suspended within an aperture through which the fan module draws air. When replacing the fan module, which has a complementary electrical connector coupled thereto, the electrical connector coupled to the annulus stays in place. Accordingly, a user simply inserts the new fan module into the fan receiver sufficiently to engage the complementary electrical connector with the electrical connector. Consequently, fan modules can be removed by hand and can be installed and uninstalled without rerouting or manipulating any electrical connectors or wiring.

Advantageously, embodiments of the disclosure allow users to maintain only a single part number for the fan module that allows replacement of fan modules at any position along a chassis. This is in contrast to prior art systems that require a technician to pull several different parts under several different part numbers simply to replace a fan. Embodiments of the disclosure offer improved ergonomics and ease of handling as well. Additionally, fan modules configured in accordance with embodiments of the disclosure can be used with all sorts of different chassis sizes.

In one or more embodiments, the fan module is easily replaced due in part to the fact that the fan receiver is mounted to the exterior of a chassis. A threaded endcap that attaches to the fan receiver allows easy access to the fan module. Replacement of the fan module can occur without using fasteners or any special tooling.

In one embodiment, a replaceable fan assembly includes three simple components: a fan receiver, a fan module, and a threaded endcap. The assembly steps include: snapping the fan receiver onto a chassis portion, sliding the fan module into the fan receiver sufficiently to mate a complementary electrical connector disposed along the fan module with an electrical connector attached to the chassis portion, and screwing the threaded endcap onto the fan receiver. Embodiments of the disclosure are simple. However, they thoroughly secure a fan assembly within a fan receiver using snap-in, rail-guide and threaded features that are integrated into the fan receiver. Assembly and fan module replacement in the field is achieved outside the chassis without the need of any special tooling. This size-scalable design can be used in any of a number of applications.

Embodiments of the disclosure differ significantly from prior art designs. Illustrating by example, U.S. Pat. No. 8,784,167 to Yi describes a fan mounted on a chassis using a set of openings disposed at a bottom-front of the fan for receiving a set of flanges extending from a chassis. The fan also uses a set of snap-in couplings to lock the fan in a position relative to a base of the chassis. This chassis interface suspends the fan above the base of the chassis with no contact between the fan assembly and the base of the chassis. Embodiments of the present disclosure differ from this prior art design in that it employs a fan receiver disposed outside the chassis, which results in simple fan replacement without disassembling the chassis as is required in the '167 patent.

U.S. Pat. No. 6,994,517 to Gatley, Jr. et al. describes a furnace blower or fan that has a tubular housing connected between a heating furnace and an exhaust flue of furnace. In this reference, the fan assembly is connected to a side of the tubular housing using four screws at the exterior of the fan housing that couple to the tubular housing. Embodiments of the disclosure differ from the '517 patent by allowing a fan module to be inserted into a fan receiver along a central axis, with the fan receiver capped by a threaded endcap. Once again, this advantageously allows the fan module to be replaced without having to completely disassemble a housing using special tools.

U.S. Pat. No. 6,357,247 to Moretti describes a fan motor with an annular bolting flange surrounding the motor casing or housing. The motor flange is bolted to a wall with a hole for receiving the motor casing. This wall is attached to the divider wall inside an air conditioner by four screws. Embodiments of the disclosure differ from the '247 patent in that no screws or special tools are required. Additionally, fan modules configured in accordance with embodiments of the present disclosure allow fan replacement without having to disassemble the corresponding device U.S. Pat. No. 6,186,889 to Byrne describes a fan module that is mounted to electrical equipment through a fan bay area via a mounting bracket both configured to be removable to receive and cradle the fan assembly. Embodiments of the disclosure differ from the '889 patent in that it employs a fan receiver disposed outside the chassis, which results in simple fan replacement without exposing the interior of the chassis to dirt, contaminants, and debris. Moreover, the '889 patent uses a bracket to complete the assembly of the fan to the chassis. Such a bracket is not required with embodiments of the present disclosure.

US Published Patent Application No. 2004/0191089 to Chang describes a fan assembly mechanism for mounting on a wall surface of a casing. This mechanism has a flat mounting surface and space to receive at least one fan using an elastic fastener and a latching feature. Embodiments of the disclosure differ from the '089 application in that the fan module simply slides into a fan receiver. This is in contrast to the two fixing features required by the '089 application, i.e., an elastic fastener and a latching feature, each of which is required to retain the fan along the wall surface.

U.S. Pat. No. 6,343,012 to Rife describes a fan assembly where the fan is threaded to a retainer clip that is placed directly over the surface of a semiconductor device or component. Embodiments of the disclosure differ from the '012 patent in that the fan module simply slides into a fan receiver and does not require threading Additionally, as noted above, embodiments of the disclosure provide a device housing that can simply snap to the exterior of a chassis portion, thereby eliminating the need to take the device off-line while replacing the fan module.

U.S. Pat. No. 6,650,541 to Simon et al. describes a fan-securing device that is assembly to the interior of a heat transfer device using fasteners and compression tabs to secure the fan to the base of heat transfer device. Embodiments of the disclosure differ from the '541 patent in that the fan assembly of the '541 patent is secured into a heat transfer device while embodiments of the present disclosure attach to an exterior of a chassis.

U.S. Pat. No. 8,405,989 to Wang describes a mounting apparatus for a fan includes an accommodating member, a bracket rotatably received in the accommodating member, a latching tab contrastively exposed through the bracket, and a torsion spring. Embodiments of the disclosure differ from the '989 patent in that any need of a bracket, latching tab, and torsion spring is completely eliminated. The '989 patent requires these devices to absorb any vibration coming from the operating fan.

U.S. Pat. No. 7,959,419 to Borowski describes a removable fan for electronic devices that works as a cooling system. The cooling system includes a receiving assembly and a removable fan assembly. The receiving assembly has a first component of a bayonet lock and first electrical contact, while the fan assembly has a fan blade, a motor for the fan blade, a second component of the bayonet lock, and a second electrical contact. The first and second electrical contacts are situated with radial respect to each other such that turning the fan assembly to engage the bayonet lock forces an electrical connection between the first and second electrical contacts. Embodiments of the disclosure differ from the '419 patent by eliminating the need for any bayonet lock system with an arrangement of an electric contacts between fan assemblies. Moreover, embodiments of the disclosure feature a rail-guide extending along the length of the fan module, which provides a much stable, secure mechanism with a single electrical contact arrangement.

U.S. Pat. No. 6,714,411 to Thompson et al. describes a fan tray assembly that includes two or more fan assemblies for cooling the interior of the chassis. This fan tray allows the fan assembly to be removed from rear side. Embodiments of the disclosure differ from the '411 patent in that fan receiver of embodiments of the present disclosure are mounted to an exterior of a chassis in an extended position.

U.S. Pat. No. 5,788,566 to McAnally et al. teaches a fan/finger guard assembly for a computer, or other types of electronic equipment, in which a housing is provided for receiving a fan rotor and a motor and having at least one opening extending there through. The housing extends between, and in abutment with, a mounting plate attached to a wall of the enclosure and a finger guard for covering the fan rotor. At least one locking member extends from the mounting member and into the opening in the housing, and at least one locking member extends from the finger guard and into the opening in the housing and in engagement with the locking member of the of mounting plate. As a result, the assembly is locked to the wall of the enclosure. Embodiments of the disclosure differ from the '566 patent in that they include a simple, three-module assembly that includes a chassis portion, a fan receiver, and an end cap, each if which is disposed outside a chassis. This structure nests a fan module securely within the fan receiver, and allows simpler replacement than does the '566 patent.

Turning now to FIGS. 1-11, illustrated therein is one embodiment of a fan assembly 100 in accordance with one or more embodiments of the disclosure. In one embodiment, the fan assembly 100 includes a chassis portion 101, a fan receiver 102, a fan module 103, and an endcap 104. As will be shown below with reference to FIG. 17, in one embodiment the chassis portion 101 is disposed alongside a chassis, which can be wall-mounted, desktop mounted, or rack mounted. Accordingly, in one or more embodiments the chassis portion is disposed along the side of the chassis and can be manufactured from metal.

In one embodiment, each of the fan receiver 102 and the endcap 104 are manufactured from a thermoplastic material by way of an injection molding process. For example, in one embodiment each of the fan receiver 102 and the endcap 104 is manufactured from a polycarbonate plastic resin via an injection molding process. Other thermoplastic materials may also be used, such as acrylonitrile butadiene styrene (ABS), polycarbonate, and polycarbonate-ABS due to their durability. Other equivalents, such as styrene for example, may be substituted. In other embodiments, the fan receiver 102 and the endcap 104 can be manufactured from other materials, such as metal. For example, in one embodiment the fan receiver 102 and endcap 104 are manufactured from a material such as spring steel, stainless steel, or other materials.

The fan receiver 102 defines a fan receiver sidewall 113. In this illustrative embodiment, the fan receiver sidewall 113 has a circular cross section such that the fan receiver sidewall 113 generally defines a cylindrical shape. As best shown in FIGS. 4-6, in one embodiment the fan receiver sidewall 113 defines an inner surface 401, an outer surface 402, a receiving opening 403 disposed at the first end 105 of the fan receiver, and a duct opening 404 disposed at a second end 106 of the fan receiver 102. The fan receiver 102 also defines a central axis 405.

Figure 11:
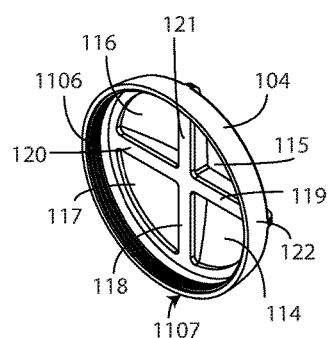
Figure 12:
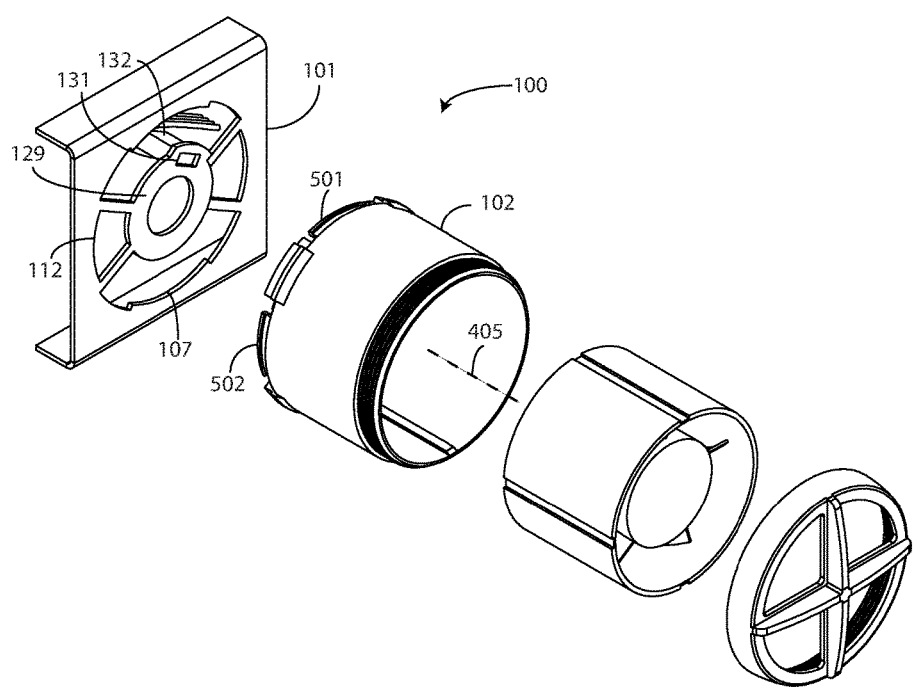
FIGS. 12-14 illustrate various method steps of assembling a fan assembly in accordance with one or more embodiments of the disclosure.

In one or more embodiments, the outer surface 402 comprises a helical ridge 406 defining a threaded male member 407 disposed at the second end 106 of the fan receiver. As best shown in FIG. 11, in one embodiment the endcap 104 comprises a complementary helical ridge 1106 that defines a threaded female member 1107. By placing the endcap 104 at the second end 106 of the fan receiver 102 and twisting the endcap 104 about the central axis 405, the endcap 104 can be selectively attached to the fan receiver 102 or detached from the fan receiver 102 by way of the threaded connection occurring between the threaded male member 407 and the threaded female member 1107. As will be described in more detail below, when replacing the fan module 103, a user simply unscrews the endcap 104, replaces the fan module 103, and screws the endcap 104 back onto the fan receiver 102 to quickly and simply replace the fan module 103 without using any special tools.

In one or more embodiments, the endcap 104 is a vented endcap in that it includes one or more vents 114,115,116,117 disposed along a major face of the endcap 104. In the illustrative embodiment of FIGS. 1-11, the vents 114,115, 116,117 are separated by four mechanical struts 118,119, 120,121 that extend from an annular ring 122 of the endcap 104 to a nucleus terminus 123 that is disposed along the central axis 405 of the fan receiver 102 when the endcap 104 is coupled to the fan receiver 102. When the fan module 103 is nested within the fan receiver 102 and active, the fan module 103 can draw air from the chassis through the aperture 107 of the chassis portion 101, through the fan module 103, and out through the vents 114,115,116,117.

The mechanical struts 118,119,120,121, in one embodiment, serve not only as mechanical stabilizers but as a user interface as well. For example, to twist the endcap 104 on, or off, the fan receiver 102, a user might grasp the annular ring 122 of the endcap 104. As an alternative, the user may instead grasp one or more of the mechanical struts 118,119, 120,121 to twist the endcap 104 on or off the fan receiver 102.

The mechanical struts 118,119,120,121 can also serve as airflow direction regulators. For example, in one embodiment the mechanical struts 118,119,120,121 can be moveable so that a user can change their angle relative to the annular ring 122 so as to redirect air upward, downward, to the right, or to the left from the chassis portion 101. In still other embodiments, the mechanical struts 118,119,120,121 can be permanently molded so as to direct air upward, downward, to the right, or to the left from the chassis portion 101. Other configurations will be obvious to those of ordinary skill in the art having the benefit of this disclosure.

In one embodiment, the endcap 104 is to cover the receiving opening 403 when the threaded female member 1107 is coupled to the threaded male member 407. Accordingly, the mechanical struts 118,119,120,121 can also serve as safety features that prevent a user from contacting the moving fan blades 701,702,703 of the fan module 103.

In one embodiment, the fan receiver 102 is to attach to the chassis portion 101 at a first end 105 of the fan receiver 102. In this illustrative embodiment, the chassis portion 101 defines an aperture 107. As best seen in FIG. 5, in one embodiment the fan receiver 102 can include one or more cantilevered snaps 501,502,503,504 disposed at the first end 105 of the fan receiver 102 to attach to the chassis portion 101.

For example, cantilevered snap 501 of FIG. 5 includes an inclined ramp 505 and a cantilevered arm 506. The inclined ramp 505 defines a surface to deflect the cantilevered arm 506 toward the central axis 405 of the fan receiver 102 when the first end 105 of the fan receiver is pressed against the chassis portion 101 so as to cause the inclined ramp 505 to engage the perimeter 112 of the aperture 107 of the chassis portion 101. Said differently, in one embodiment the one or more cantilevered snaps 501,502,503,504 are to deflect about the perimeter 112 of the aperture 107 of the chassis portion 101 toward the central axis 405 when the fan receiver 102 attaches to the chassis portion 101.

Once the inclined ramp 505 fully extends through the aperture 107 of the chassis portion 101, the cantilevered arm 506 deflects away from the central axis 405 to allow a backwall 507 of the inclined ramp 505 to retain the fan receiver 102 securely attached to the chassis portion 101. In one embodiment, to provide for this angular deflection, the material of the fan receiver 102 is compliant so that the cantilevered arm 506 can angularly deflect relative to the central axis 405 between three and ten degrees without compromising the structural integrity of the cantilevered arm 506.

In one or more embodiments, the fan receiver 102 further comprises one or more mechanical stops 508,509 to limit an amount of mechanical engagement between the chassis portion 101 and the fan receiver 102. As an alternative to the mechanical stops 508,509, or to operate in concert therewith, the chassis portion 101 can include one or more mechanical struts 124,125,126,127 extending from a chassis surface 128 to an annulus 129. In one or more embodiments, the mechanical struts 124,125,126,127 can also function as a mechanical stop to limit the amount of mechanical engagement between the chassis portion 101 and the fan receiver 102 when the one or more cantilevered snaps 501,502,503, 504 engage the chassis portion 101. Of course, the mechanical stops 508,509 of the fan receiver 102 and the mechanical struts 124,125,126,127 of the chassis portion 101 can work together to limit the amount of mechanical engagement as well.

In one embodiment, annulus 129 of the chassis portion 101 is suspended within the aperture 107 by the one or more mechanical struts 124,125,126,127. Air can pass about the annulus 129 and through an aperture 130 concentrically disposed within the annulus 129 when the fan module 103 is nested within the fan receiver 102. In one or more embodiments, the annulus 129 comprises a coupler 131 to attach to an electrical connector 132. The electrical connector 132 is attached to a cable assembly 133 to provide power to the fan module 103 when it is nested within the fan receiver 102.

Figure 9:
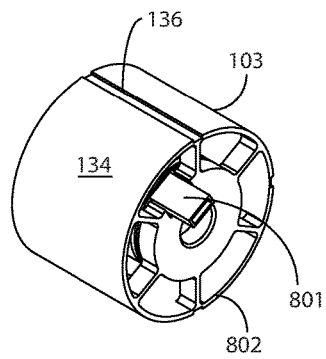
Figure 8:
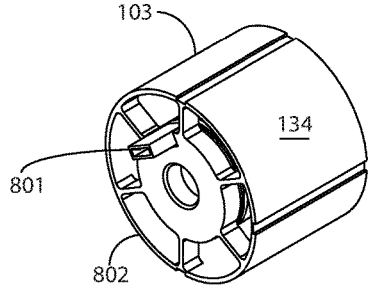
Figure 10:
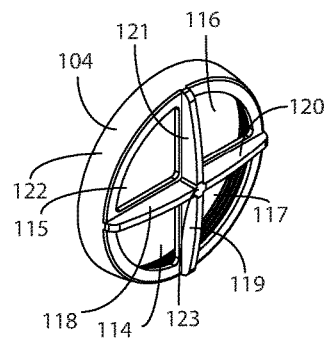
FIGS. 10-11 illustrate various views of one explanatory vented endcap in accordance with one or more embodiments of the disclosure.

In one embodiment, so as to eliminate the need to manipulate the electrical connector 132 when changing the fan module 103, the electrical connector 132 can be perdurably connected to the coupler 131 as shown in FIG. 3. In one or more embodiments, as best shown in FIGS. 8 and 9, the fan module 103 can comprise a complementary electrical connector 801 disposed at an end 802 of the fan module 103. In one embodiment, the complementary electrical connector 801 is to couple to the electrical connector 132 when the fan module 103 is disposed within the fan receiver 102.

Accordingly, when a fan module 103 is removed from the fan receiver 102, the electrical connector 132 stays connected to the coupler 131 of the annulus 129. When the fan module 103 is replaced, a user or technician can press the fan module 103 into the fan receiver 102 such that a complementary electrical connector 801 disposed along a rear side of the fan module 103 connects with the electrical connector 132. This arrangement of the electrical connector 132 attached to the coupler 131 of the annulus 129 of the chassis portion 101 allows quick and simple fan module replacement without the need to manipulate cables, connectors, or wire harnesses.

In one embodiment, the aperture 107 of the chassis portion 101 comprises one or more optional alignment gaps 108,109,110,111 disposed along a perimeter 112 of the aperture 107. In this illustrative embodiment, four alignment gaps 108,109,110,111 are disposed along the perimeter 112 of the aperture 107. However, in other applications more than, or fewer than, four alignment gaps 108,109,110,111 can be disposed along the perimeter 112 of the aperture 107 as well.

In one embodiment, the fan receiver 102 comprises one or more optional alignment protuberances 510,511,512,513. Where alignment gaps 108,109,110,111 and alignment protuberances 510,511,512,513 are included, the alignment protuberances 510,511,512,513 can engage the one or more alignment gaps 108,109,110,111 when the fan receiver 102 is coupled to the chassis portion 101 to ensure that a predefined alignment between the fan receiver 102 and the chassis portion 101 occurs consistently. As noted, the alignment gaps 108,109,110,111 and alignment protuberances 510,511,512,513 are optional. However, including them is helpful, for example, in ensuring that the electrical connector 132 and the complementary electrical connector 801 mate to provide power to the fan module 103.

In one or more embodiments, an inner surface 515 of the fan receiver 102 includes at least one insertion guiderail key 514,614. In this illustrative embodiment, each insertion guiderail key 514,614 is oriented substantially parallel with the central axis 405 of the fan receiver 102. As used herein, the term "about" or "substantially" refers to a measurement, configuration, or alignment that is inclusive or manufacturing tolerances. For example, an angle designed and specified to be orthogonal with manufacturing tolerances of plus or minus 1.5 degrees may be, due to those manufacturing tolerances, 89.1, 91.2, 90.6, or some other angle and still be substantially orthogonal as the term is used herein.

Similarly, in one or more embodiments the fan module 103 comprises an exterior fan module sidewall 134 defining at least one insertion guiderail keyseat 135,136. In one embodiment, the insertion guiderail keyseat 135,136 is to engage the insertion guiderail key 514,614 when the fan module 103 inserts into the fan receiver 102. In one embodiment, the insertion guiderail keyseat 135,136 is to translate along the insertion guiderail key 514,614 when the fan module 103 inserts into the receiving opening 403 of the fan receiver 102.

In this illustrative embodiment, the at least one insertion guiderail key 514,614 comprises a plurality of insertion guiderails and the at least one insertion guiderail keyseat 135,136 comprises a plurality of insertion guiderail keyseats. The number of insertion guiderail keys 514,614 and insertion guiderail keyseats, 136 can vary based upon application. In this illustrative embodiment, there are three insertion guiderail keys and three insertion guiderail keyseats. However, one, two, four, five, or more can be used in other applications. Similarly, while the insertion guiderail key 514,614 and the insertion guiderail keysesats 135,136 are configured as parallel keys/keyseats having a rectangular cross section, other types of keys/keyseats can be used instead. These include tapered keys, Scotch Keys, Dutch Keys, feathered keys, and Woodruff Keys. Other types of keys and keyseats will be obvious to those of ordinary skill in the art having the benefit of this disclosure.

While optional, the insertion guiderail key 514,614 can be used to ensure that the fan module 103 inserts within the fan receiver 102 with the proper alignment. This alignment can help to ensure that the electrical connector 132 and the complementary electrical connector 801 mate to provide power to the fan module 103. Additionally, the insertion guiderail keys 514,614 can be used to ensure that the rotational torque of the fan blades 701,702,703 to not cause the exterior fan module sidewall 134 to rotate within the fan receiver 102 when the fan is operational.

Figure 13:
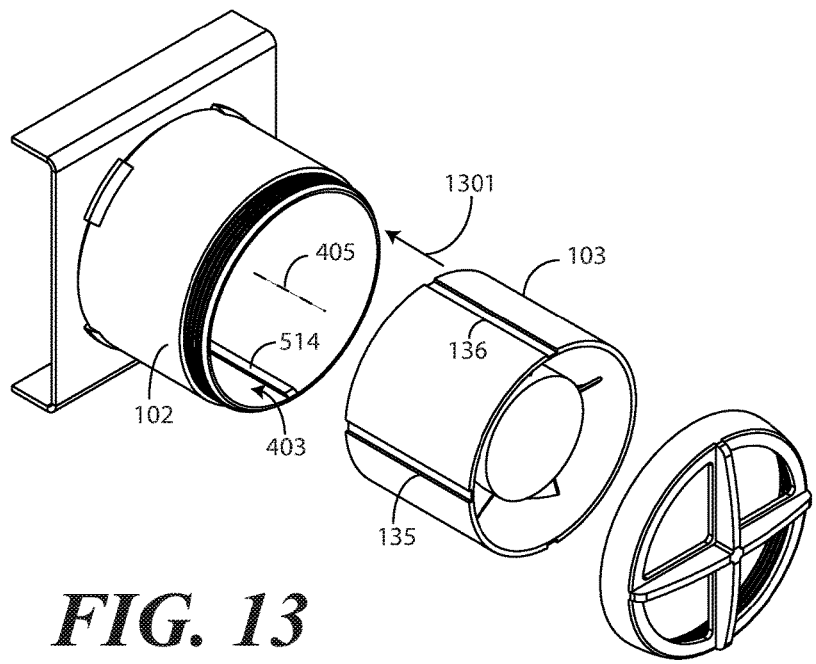

Turning now to FIGS. 12-15 illustrated therein are explanatory method steps for assembling a fan assembly 100 in accordance with one or more embodiments of the disclosure. Beginning with FIG. 12, the electrical connector 132 is perdurably attached to the coupler 131 of the annulus 129 of the chassis portion 101. A user or technician then presses the fan receiver 102 into the aperture 107 of the chassis portion 101 such that the one or more cantilevered snaps 501,502, (503,504) deflect about the perimeter 112 of the aperture 107 toward the central axis 405 when the fan receiver 102 attaches to the chassis portion 101. The result is shown in FIG. 13.

Figure 14:
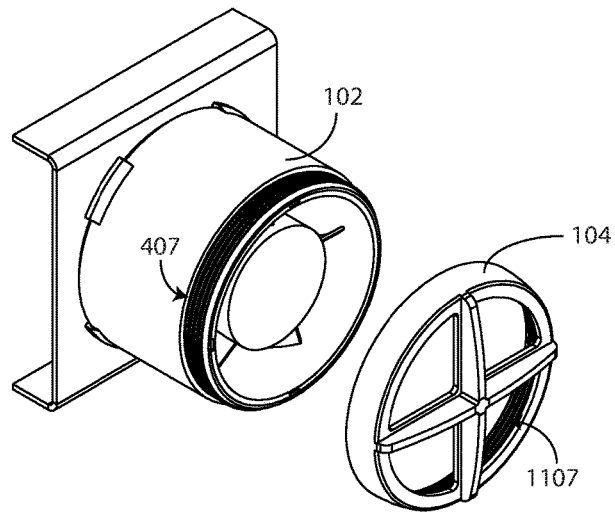
Figure 15:
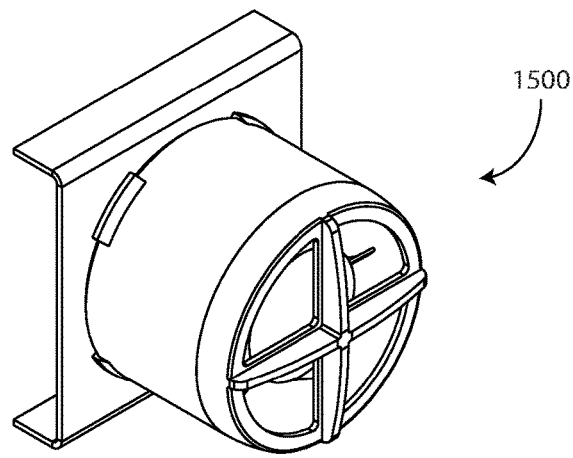
FIG. 15 illustrates one example of a single, assembled fan assembly in accordance with one or more embodiments of the disclosure.

The user or technician then inserts 1301 the fan module 103 into the receiving opening 403 of the fan receiver 102. In one embodiment, the fan module 103 inserts into the receiving opening 403 along the central axis 405. In one or more embodiments, this insertion includes aligning the insertion guiderail keyseat 135,136 of the fan module 103 such that it engages and translates along the insertion guiderail key 514, (614) when the fan module 103 is inserted into the fan receiver 102. The result is shown in FIG. 14.

Figure 16:
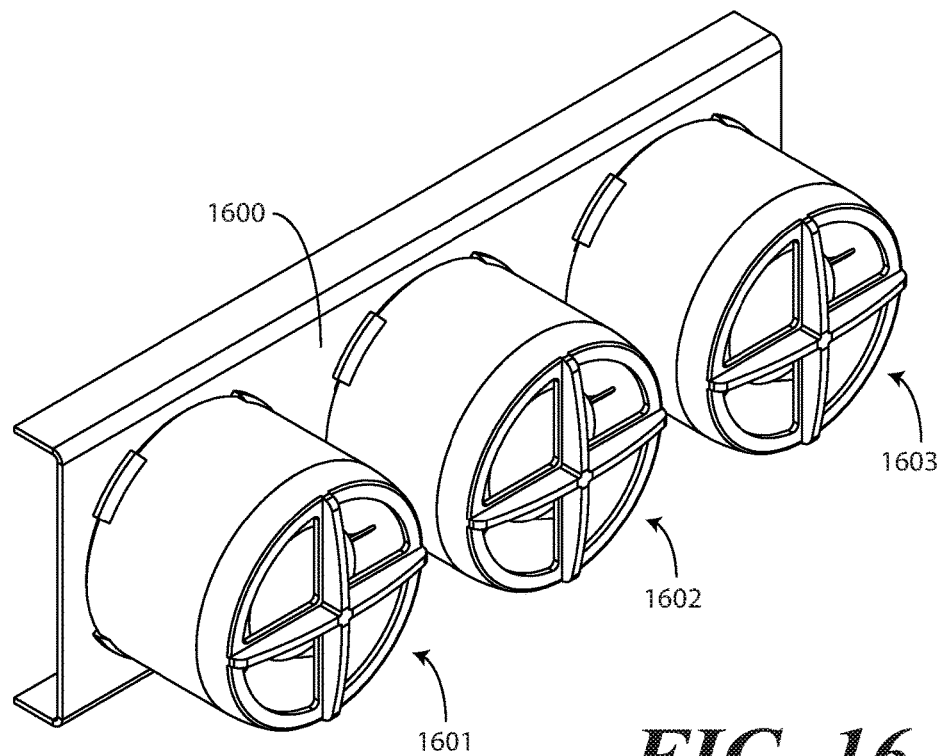
FIG. 16 illustrates one example of a multi-unit, assembled fan assembly in accordance with one or more embodiments of the disclosure.
Figure 17:
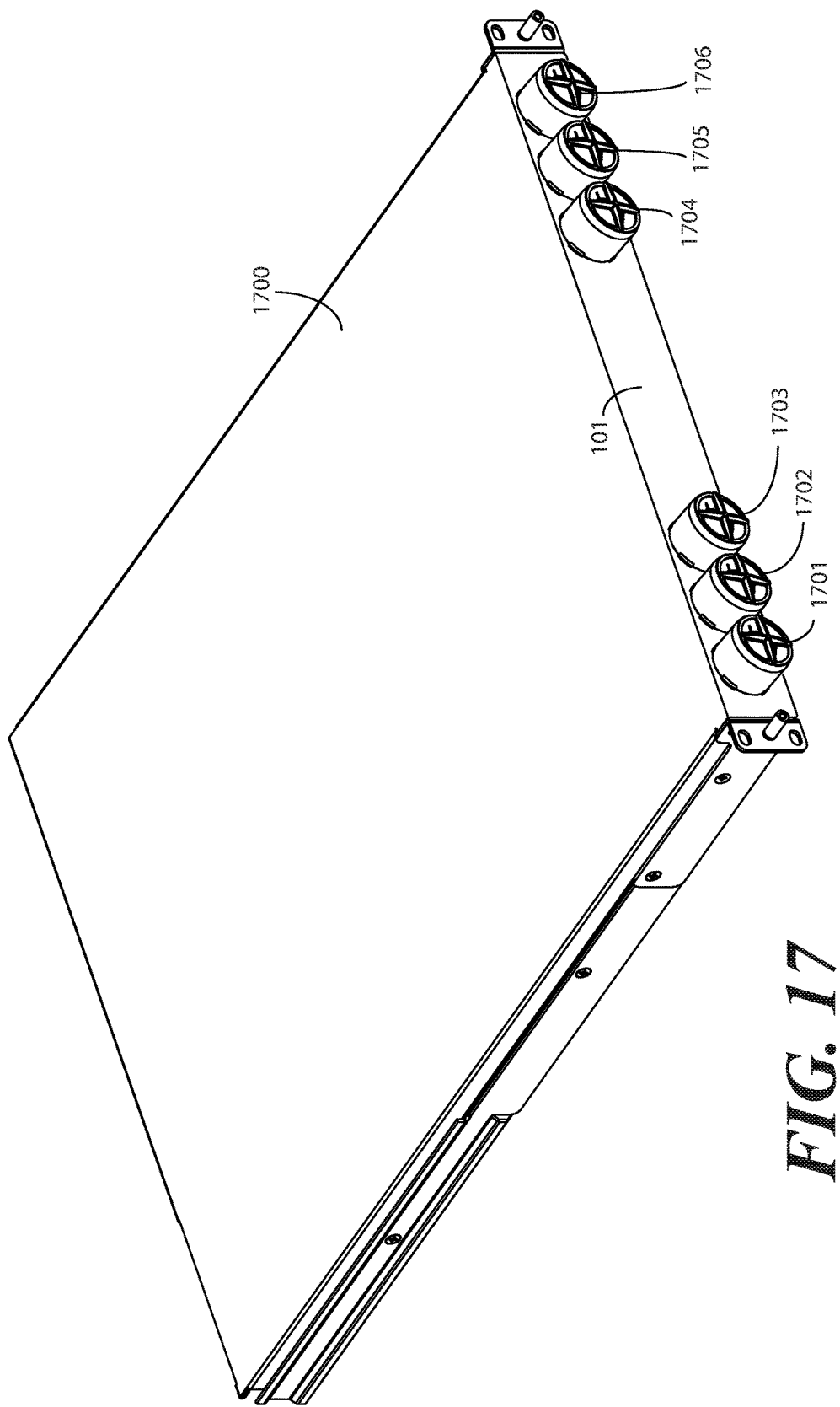
FIG. 17 illustrates front, top, right perspective view of an explanatory chassis in accordance with one or more embodiments of the disclosure.
Figure 18:
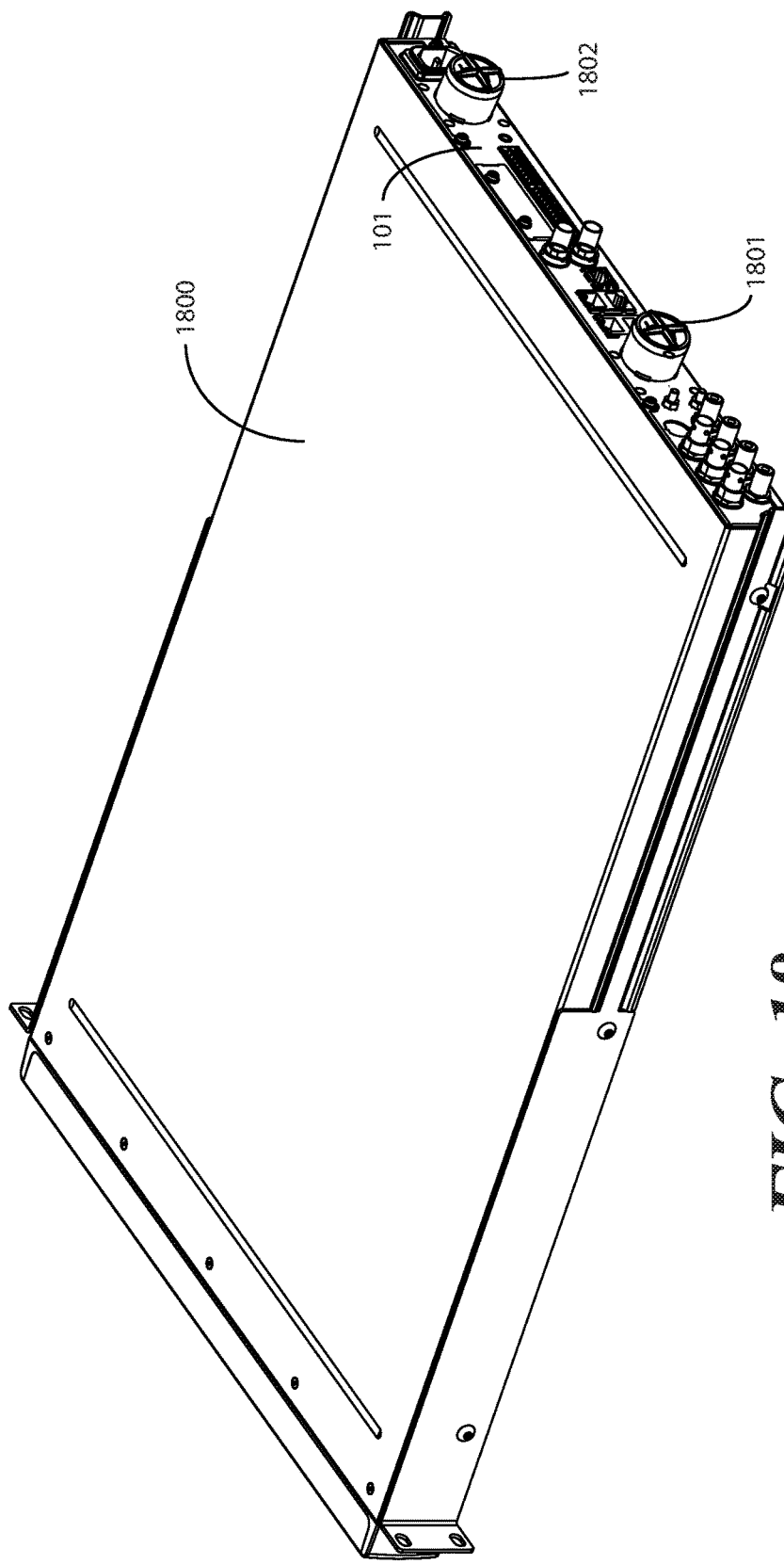
FIG. 18 illustrates a rear, top, left perspective view of another explanatory chassis in accordance with one or more embodiments of the disclosure.

The user or technician then twists the threaded female member 1107 of the endcap 104 about the threaded male member 407 of the fan receiver 102 to attach the endcap 104 to the fan receiver 102. The result is shown in FIG. 14 as a completed fan assembly 1500. As shown in FIG. 16, multiple fan assemblies 1601,1602,1603 can be disposed along a common chassis portion 1600. One or more fans 1701, 1702,1703,1704,1705,1706 attached to the front of a rack mounted chassis 1700 are shown in FIG. 17. In this figure, the chassis portion 101 is disposed along the front of the rack-mounted chassis 1700. In FIG. 18, one or more fans 1801,1802 are attached to the rear of a rack-mounted chassis 1800. In this figure, the chassis portion 101 is disposed along the rear of the rack-mounted chassis 1800. The contrast between FIGS. 17-18 illustrate how embodiments of the disclosure can be attached to various sides of a rack-mounted chassis 1700,1800. Other attachment locations will be obvious to those of ordinary skill in the art having the benefit of this disclosure.

As shown and described, a fan assembly (100) can include a chassis portion (101), a fan receiver (102) comprising a fan receiver sidewall (113) coupled to the chassis portion (101) at a first end (105) of the fan receiver (1020, a fan module (103) nested within the fan receiver sidewall (113), and an endcap (104) coupled to the fan receiver sidewall (113) at a second end (106) of the fan receiver (102) to retain the fan module (103) nested within the fan receiver sidewall (113) between the chassis portion (101) and the endcap (104). The endcap (104) can be a vented endcap to retain the fan module (103) within the fan receiver (102), while allowing air to pass through the vents.

An inner surface (515) of the fan receiver sidewall (113) can include a key, such as insertion guiderail key (514), while an outer surface, i.e., the exterior fan module sidewall (134), of the fan module (103) can include a keyseat, such as insertion guiderail keyseat (135). The keyseat can then engage the key when the fan module (103) is nested within the fan receiver sidewall (113). The endcap (104) can be coupled to the fan receiver (102) by a threaded connection to provide a simple yet robust housing that makes changing the fan module (103) quick and simple.

Embodiments of the disclosure provide a fan assembly that allows for the tool-less removal of fan modules via a simple "twist endcap OFF, replace fan module, twist endcap ON" process. Advantageously, a technician can replace a fan very quickly using only their fingers. In one or more embodiments, this quick swap of the fan can occur while the components within the chassis are running, thereby allowing the technician to perform a "hot swap" (replacement of fan assemblies without taking the device the fans are cooling off-line) on the fan module without the need for any complex tools.

Embodiments of the disclosure offer numerous advantages over prior art designs. In one embodiment, the fan receiver design allows easy access from the side of the chassis to the fan modules without the need of disassembling the chassis. Specialized tools and devices are not required for fan replacement. Embodiments of the disclosure provide a competitive advantage for serviceability in the field by reducing equipment down time. Embodiments of the disclosure specifically address, and provide advantageous solutions for, field replacement of centrally mounted fans without the need to remove the chassis cover. Embodiments of the disclosure provide competitive advantages by reducing failed fan replacement time. Further, embodiments of the disclosure advantageously allow for fan assemblies to be swapped without taking accompanying equipment offline.

Still other advantages will be obvious to those of ordinary skill in the art having the benefit of this disclosure.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A fan assembly, comprising:
   a chassis portion;
   a fan receiver coupled to the chassis portion at a first end of the fan receiver and comprising a fan receiver sidewall defining:
      an inner surface;
      an outer surface;
      a receiving opening;
      a central axis; and
      a fan module to insert into the receiving opening along the central axis, the fan module comprising an exterior fan module sidewall defining at least one insertion guiderail keyseat to engage an insertion guiderail key when the fan module inserts into the receiving opening;
   the inner surface comprising at least one insertion guiderail key oriented substantially parallel with the central axis; and
   the outer surface comprising a threaded male member at a second end of the fan receiver.

2. The fan assembly of claim 1, further comprising a vented endcap to cover the receiving opening, the vented endcap comprising a threaded female member to engage the threaded male member.

3. The fan assembly of claim 1, the fan receiver sidewall having a circular cross section.

4. The fan assembly of claim 1, the at least one insertion guiderail keyseat to translate along the at least one insertion guiderail key when the fan module inserts into the receiving opening.

5. The fan assembly of claim 4, the at least one insertion guiderail key comprising a plurality of insertion guiderail keys, the at least one insertion guiderail keyseat comprising a plurality of insertion guiderail keyseats.

6. The fan assembly of claim 1, further comprising a vented endcap to retain the fan module within the fan receiver.

7. The fan assembly of claim 6, the vented endcap comprising a threaded female member to attach to the threaded male member.

8. A fan assembly, comprising
   a chassis portion;
   a fan receiver coupled to the chassis portion at a first end of the fan receiver and comprising a fan receiver sidewall defining:
      an inner surface;
      an outer surface;
      a receiving opening; and
      a central axis;
      the fan receiver comprising one or more cantilevered snaps disposed at the first end of the fan receiver to attach to the chassis portion;
   the chassis portion defining an aperture having one or more alignment gaps disposed along a perimeter of the aperture, the fan receiver further comprising one or more alignment protuberances to engage the one or more alignment gaps;
   the inner surface comprising at least one insertion guiderail key oriented substantially parallel with the central axis; and
   the outer surface comprising a threaded male member at a second end of the fan receiver.

9. The fan assembly of claim 8, the fan receiver further comprising one or more mechanical stops to limit an amount of mechanical engagement between the chassis portion and the fan receiver.

10. The fan assembly of claim 8, the one or more cantilevered snaps to deflect about the perimeter of the aperture toward the central axis when the fan receiver attaches to the chassis portion.

11. The fan assembly of claim 8, the chassis portion comprising an annulus suspended within the aperture by one or more mechanical struts, the annulus comprising a coupler to attach to attach to an electrical connector.

12. The fan assembly of claim 11, further comprising the electrical connector coupled to the coupler.

13. The fan assembly of claim 12, further comprising a fan module comprising a complementary electrical connector disposed at an end of the fan module, the complementary electrical connector to couple to the electrical connector when the fan module is disposed within the fan receiver.

14. The fan assembly of claim 8, the fan receiver sidewall having a circular cross section.

15. The fan assembly of claim 8, further comprising:
    a fan module nested within the fan receiver sidewall; and
    an endcap coupled to the fan receiver sidewall at a second end of the fan receiver to retain the fan module nested within the fan receiver sidewall between the chassis portion and the endcap.

16. The fan assembly of claim 15, an inner surface of the fan receiver sidewall comprising a key, an outer surface of the fan module comprising a key seat, the key seat to engage the key when the fan module is nested within the fan receiver sidewall.

17. The fan assembly of claim 15, the endcap coupled to the fan receiver sidewall by a threaded connection.

18. The fan assembly of claim 15, the chassis portion disposed along a side of a chassis, the fan receiver disposed exterior to the chassis.

* * * * *